US012660552B2

(12) United States Patent
Byun et al.

(10) Patent No.: US 12,660,552 B2
(45) Date of Patent: Jun. 16, 2026

(54) PICK-AND-PLACE APPARATUS OF MICRO LED CHIP FOR CHIP-REPAIRING OF MICRO LED DISPLAY

(71) Applicant: ENJET CO. LTD., Suwon-si (KR)

(72) Inventors: Do Young Byun, Gangnam-gu (KR); Vu Dat Nguyen, Suwon-si (KR)

(73) Assignee: ENJET CO. LTD., Suwon-si (KR)

( * ) Notice: Subject to any disclaimer, the term of this patent is extended or adjusted under 35 U.S.C. 154(b) by 727 days.

(21) Appl. No.: 17/961,411

(22) Filed: Oct. 6, 2022

(65) Prior Publication Data

US 2023/0129644 A1 Apr. 27, 2023

(30) Foreign Application Priority Data

Oct. 21, 2021 (KR) ........................ 10-2021-0140991

(51) Int. Cl.
H10H 20/01 (2025.01)
B25J 9/16 (2006.01)
(Continued)

(52) U.S. Cl.
CPC ........ H10P 72/0446 (2026.01); B25J 9/1697 (2013.01); B25J 13/08 (2013.01);
(Continued)

(58) Field of Classification Search
CPC ...... B25J 13/08; B25J 13/085; B25J 15/0658; B25J 15/0683; B25J 9/1697;
(Continued)

(56) References Cited

U.S. PATENT DOCUMENTS 8,156,642 B2 * 4/2012 Maenishi ........... H05K 13/0061
29/830
12,513,658 B2 * 12/2025 Nam ................... H04W 64/006
(Continued)

FOREIGN PATENT DOCUMENTS

CN 112967981 A 6/2021
JP H10242030 A * 9/1998
(Continued)

OTHER PUBLICATIONS

Korean Office Action (w/ English translation) for corresponding Application No. 10-2021-0140991, issued on Aug. 14, 2023, 13 pages.
(Continued)

*Primary Examiner* — Scott T Baderman
*Assistant Examiner* — Mario M Velez-Lopez
(74) *Attorney, Agent, or Firm* — Dority & Manning, P.A.

(57) ABSTRACT

The present disclosure relates to a pick-and-place apparatus of micro LED chip for chip-repairing of micro LED display, including a nozzle having a capillary form and having a nozzle tip that is smaller than a top size area of the micro LED chip; a pressure adjustment part that applies negative pressure inside the nozzle to adsorb the micro LED chip to the nozzle tip and applies positive pressure inside the nozzle or removes the negative pressure inside the nozzle to mount the micro LED chip adsorbed to the nozzle tip onto a repair pixel; an imaging part that monitors a position and posture of the micro LED chip adsorbed to the nozzle tip in real time; a moving part that moves the nozzle; and a control part that receives image information from the imaging part, and mounts the micro LED chip onto a repair pixel while controlling the pressure adjustment part and the moving part.

14 Claims, 7 Drawing Sheets

(51) Int. Cl.

| | |
|---|---|
| *B25J 13/08* | (2006.01) |
| *B25J 15/06* | (2006.01) |
| *H10H 20/857* | (2025.01) |
| *H10P 72/00* | (2026.01) |
| *H10W 90/00* | (2026.01) |

(52) U.S. Cl.
CPC ......... *B25J 13/085* (2013.01); *B25J 15/0658* (2013.01); *B25J 15/0683* (2013.01); *H10H 20/01* (2025.01); *H10H 20/857* (2025.01); *H10W 90/00* (2026.01); *H10H 20/0364* (2025.01)

(58) Field of Classification Search
CPC ........... G05B 2219/40033; G05B 2219/45063; H01L 21/67144; H01L 21/6838; H01L 25/0753; H10H 20/01; H10H 20/0364; H10H 20/857
See application file for complete search history.

(56) References Cited

U.S. PATENT DOCUMENTS

| | | | | |
|---|---|---|---|---|
| 2009/0119904 | A1* | 5/2009 | Yamasaki | H05K 13/0409 29/593 |
| 2011/0297590 | A1* | 12/2011 | Ackley | G01N 21/85 209/552 |
| 2013/0008020 | A1* | 1/2013 | Park | H01L 24/799 29/762 |

| | | | | |
|---|---|---|---|---|
| 2013/0160282 | A1* | 6/2013 | Kawaguchi | H05K 13/021 29/592.1 |
| 2013/0269184 | A1* | 10/2013 | Buchanan | H05K 13/0409 29/832 |
| 2016/0247705 | A1* | 8/2016 | Sumitani | H01L 21/67253 |
| 2018/0122664 | A1* | 5/2018 | Hsu | B65G 61/00 |
| 2019/0014698 | A1* | 1/2019 | Kawaguchi | H05K 13/0413 |
| 2019/0335630 | A1* | 10/2019 | Sakurayama | H05K 13/0069 |
| 2020/0135989 | A1* | 4/2020 | Liao | H05B 45/00 |
| 2020/0135996 | A1* | 4/2020 | Liao | H01L 24/98 |
| 2021/0038777 | A1* | 2/2021 | Chen | G06V 20/00 |
| 2021/0048473 | A1* | 2/2021 | Lin | H01L 22/20 |
| 2022/0132714 | A1* | 4/2022 | Fettke | H05K 13/0486 |
| 2023/0015183 | A1* | 1/2023 | Namiki | H10H 20/01 |

FOREIGN PATENT DOCUMENTS

| | | | |
|---|---|---|---|
| JP | 2000005679 | * | 1/2000 |
| JP | 2000005679 | A | 1/2000 |
| JP | 2019169678 | A * | 10/2019 |
| KR | 10-2020-0114272 | | 10/2020 |
| KR | 20210063200 | | 6/2021 |
| KR | 20217016369 | | 7/2021 |
| TW | 202107109 | A | 2/2021 |

OTHER PUBLICATIONS

Taiwanese Office Action (w/ English translation) for corresponding Application No. 111134134, issued Mar. 9, 2023, 3 pages.
Chinese Office Action (w/English translation) for corresponding Application No. 202211229103.6, dated Jun. 24, 2025, 16 pages.

* cited by examiner

PICK-AND-PLACE APPARATUS OF MICRO LED CHIP FOR CHIP-REPAIRING OF MICRO LED DISPLAY

1. FIELD

The present disclosure relates to a pick-and-place apparatus of micro LED chip for chip-repairing of micro LED display, and more particularly, to a pick-and-place apparatus of micro LED chip for chip-repairing of micro LED display, which, after a micro LED chip is transferred to a substrate in a manufacturing process of the micro LED display, if the chip is not mounted or mounted incorrectly, mounts the micro LED chip onto a repair pixel in chip units.

2. BACKGROUND

Backlight-based LCD displays are rapidly being replaced by active-driven pixel displays such as OLED displays, micro LED displays, etc. Especially, micro LED displays are based on GaN deposition film technology and is emerging as a next-generation display because of its superior contrast and illuminance, fast response time, and high energy efficiency compared to OLED display technology.

Micro LED display technology is a representative convergence technology in which LED, display, and semiconductor technology are complexly combined, and the manufacturing process proceeds in the order of wafer (epi chip) manufacturing, chip processing, mass electronics, inspection, repair, and display manufacturing application.

In the case of a 4K (3840×2160) display, 24.9 million micro LED chips must be mounted, and thus if these are mounted in units of individual chips, the process cost and time increase exponentially, making mass production impossible. Therefore, a mass transfer technology is used which simultaneously mounts a large number of micro LED chips, such as a transfer method using Pick up Heads manufactured by depositing electrodes on the silicon-based head of LuxVue.

There are other well-known mass transfer technologies besides LuxVue, but no transfer technology is known to have 100% transfer yield.

Therefore, after the mass transfer, by way of a complete repair process, products of 100% yield can be manufactured. A repair process consists of a pad formation process and a chip pick-and-place process.

PRIOR ART LITERATURE

Patent Document

Korean Laid-open Patent No. 10-2020-0114272

SUMMARY

Therefore, a purpose of the present disclosure is to resolve such problems of prior art, that is to provide a pick-and-place apparatus of micro LED chip for chip-repairing of micro LED display, that uses a nozzle in the form of a capillary having a nozzle tip of the size similar or smaller than the size of a micro LED chip to adsorb the micro LED chip to the tip of the nozzle with negative pressure, so as to mount the chip on a repair area while monitoring the position and posture of the micro LED chip in real time.

The problems to be solved by the present disclosure are not limited to the problems mentioned above, and other problems not mentioned will be clearly understood by those skilled in the art from the following description.

The aforementioned purposes can be achieved by a pick-and-place apparatus of micro LED chip for chip-repairing of micro LED display, including a nozzle having a capillary form and having a nozzle tip that is smaller than a top size area of the micro LED chip; a pressure adjustment part that applies negative pressure inside the nozzle to adsorb the micro LED chip to the nozzle tip and applies positive pressure inside the nozzle or removes the negative pressure inside the nozzle to mount the micro LED chip adsorbed to the nozzle tip onto a repair pixel; an imaging part that monitors a position and posture of the micro LED chip adsorbed to the nozzle tip in real time; a moving part that moves the nozzle; and a control part that receives image information from the imaging part, and mounts the micro LED chip onto the repair pixel while controlling the pressure adjustment part and the moving part.

Here, an end portion of the nozzle may be formed such that its diameter gradually decreases.

Here, the nozzle may be formed of any one of glass, metal tube, ceramic, and polymer.

Here, the nozzle tip may be coated with a flexible material.

Here, the flexible material may be PDMS.

Here, a cleaning part that cleans the nozzle tip may be further included.

Here, an ionizer that removes static electricity from the nozzle tip may be further included.

Here, the nozzle may be disposed vertically downward towards a substrate, and the imaging part may include at least one or more first imaging part disposed at one side of the nozzle, that obtains an image of the micro LED chip adsorbed to the nozzle tip, in a direction inclined with respect to a vertically downward direction, and that monitors the position and posture of the micro LED chip on an xy plane, and a second imaging part that obtains the image of the micro LED chip adsorbed to the nozzle tip in a horizontal direction, and monitors the position and posture of the micro LED chip in a z axis direction.

Here, nozzle may be disposed to be inclined with respect to a substrate, and the imaging part may include a first imaging part that obtains an image of the micro LED chip adsorbed to the nozzle tip, in a vertically downward direction from above the nozzle tip, and that monitors the position and posture of the micro LED chip on an xy plane; and a second imaging part that obtains the image of the micro LED chip adsorbed to the nozzle tip in a horizontal direction, and monitors the position and posture of the micro LED chip in a z axis direction.

Here, it is preferable that a face of the nozzle tip of the nozzle disposed to be inclined is processed horizontally on the xy plane.

Here, the nozzle may be disposed to be inclined with respect to a substrate, but one intermediate part of the nozzle may have a bent form such that an end portion of the nozzle is close to vertical to the substrate.

Here, the imaging part may include a first imaging part that obtains an image of the micro LED chip adsorbed to the nozzle tip, in a vertically downward direction from above the nozzle tip, and that monitors the position and posture of the micro LED chip on an xy plane; and a second imaging part that obtains the image of the micro LED chip adsorbed to the nozzle tip in a horizontal direction, and that monitors the position and posture of the micro LED chip in a z axis direction.

Here, a pressing force measurement part that measures a force pressing to the nozzle in order to mount the micro LED chip onto the repair pixel, may be further included.

Here, the pressing force measurement part may measure a bent degree of the nozzle and measure the pressing force based on the measured bent degree of the nozzle.

Here, the pressing force measurement part may include a light emitting part that irradiates light towards the nozzle; a light receiving part that receives the light reflected from the nozzle; and a determining part that analyzes a signal of the light received in the light receiving part and measures the bent degree of the nozzle.

Here, the moving part may include a transfer part that transfers the nozzle in space; and a posture change part that changes a posture of the nozzle in order to change the posture of the micro LED chip adsorbed to the nozzle tip.

A pick-and-place apparatus of micro LED chip for chip-repairing of micro LED display as described above has an advantage that it uses a nozzle in the form of a capillary of the size smaller than the size of a micro LED chip to mount the ultra-fine size micro LED chip onto the exact position one-by-one while monitoring the position and posture of the micro LED chip.

DETAILED DESCRIPTION

Figure 1:
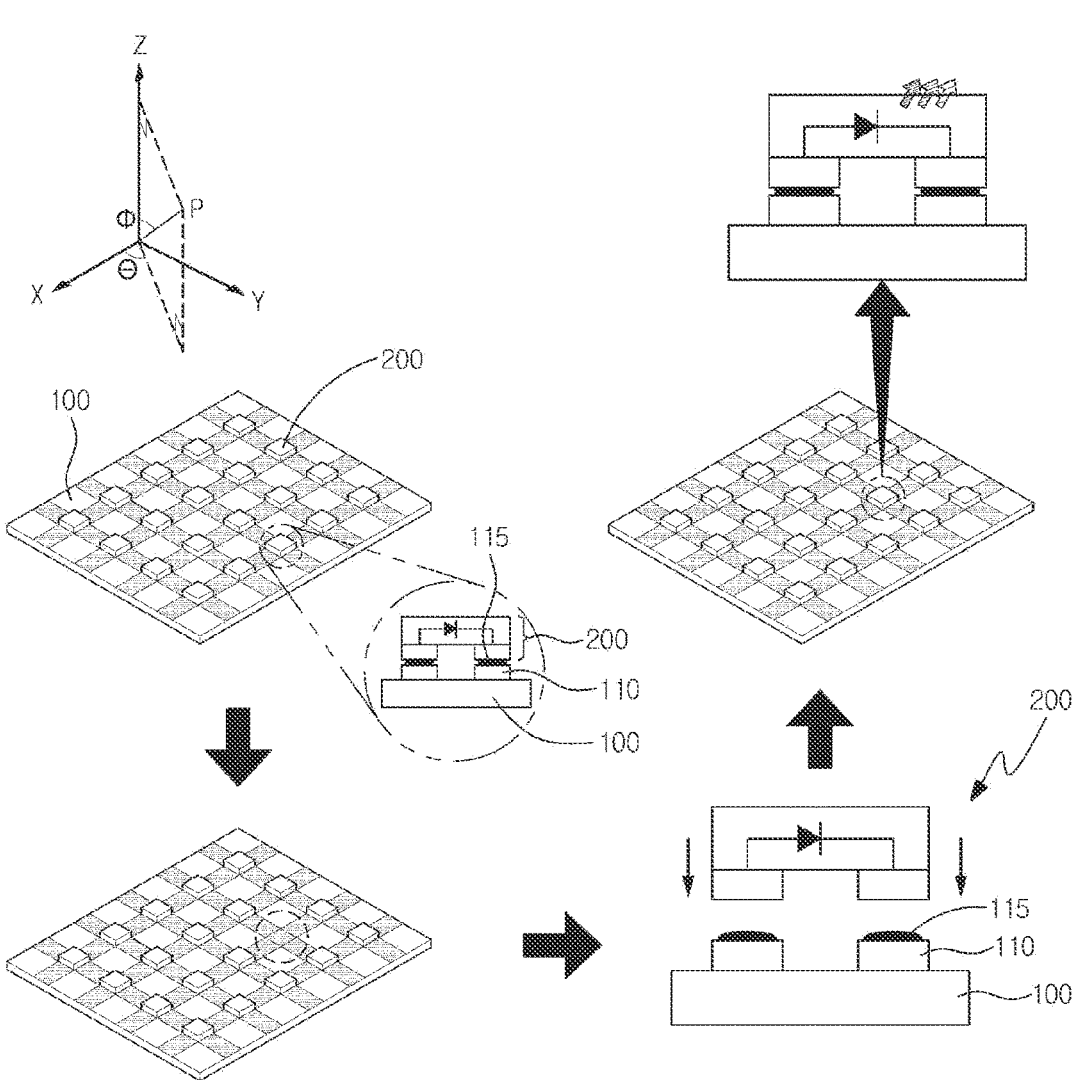
FIG. 1 is a view illustrating a repair process after a mass transfer of micro LED chips.

The specific details the embodiments are included in the detailed description and drawings.

Advantages and features of the present disclosure, and methods for achieving them, will become apparent with reference to the embodiments described below in detail in conjunction with the accompanying drawings. However, the present disclosure is not limited to the embodiments disclosed below, but can be implemented in various different forms, and these embodiments are provided merely to allow the present disclosure to be complete, and to fully inform those with common knowledge in the art to which the present disclosure pertains, and the present disclosure is defined only by the scope of the claims, Throughout the entirety of the specification, like reference numerals indicate like configuration elements.

Hereinbelow, by the embodiments of the present disclosure, with reference to the drawings for describing a pick-and-place apparatus of micro LED chip for chip-repairing of micro LED display, the present disclosure will be described.

FIG. 1 is a view illustrating a repair process after a mass transfer of micro LED chips.

First, in order to manufacture a micro LED display (module) using a micro LED chip 200, the micro LED chip 200 is transferred to a substrate 100 and mounted thereon, Here, a well-known method such as a method of using an electrostatic head may be used as the method for mass transferring the micro LED chip 200 to the substrate 100.

Since between hundreds of thousands to tens of millions of micro LED chips 200 may be mounted by the mass transfer method, even if the yield is managed very precisely, a defective micro LED chip 200 may occur in the transfer process or some of the micro LED chips 200 may not be mounted onto a target area.

A pick-and-place apparatus of micro LED chip for chip-repairing of micro LED display according to the present disclosure is an apparatus for repairing by pick-and-place of the micro LED chip 200 one-by-one in an area where it was found by an inspection process after a mass transfer that a defective micro LED chip 200 was mounted or in a target area where a micro LED chip 200 was not mounted in the mass transfer process or in a repair area that was not lighted on.

Although not illustrated, a removal apparatus for removing a defective micro LED chip 200 from among a plurality of micro LED chips 200 mounted onto the substrate 100 and the printing apparatus for forming a pad using a conductive adhesive may be configured as a single unit with the pick-and-place apparatus according to the present disclosure For example, the removal apparatus for removing a defective micro LED chip 200 may irradiate laser locally to the defective micro LED chip 200, that is the target, and remove the chip.

The size of the micro LED chip 200 is 100 μm or less (recently, ultra-fine chips with a size of 30 μm or less are being transferred), and thus the width of the pad 110 electrode being bonded may have a size of 20 μm or less. Therefore, in order to bond the pad 110 and the micro LED chip 200 for repair, a conductive adhesive material 115 must be precisely patterned in a width size of 20 μm or less on the pad 110.

As such, in a state where the conductive adhesive material 115 is patterned on the pad 110, using the pick-and-place apparatus of micro LED chip for chip-repairing of micro LED display according to the present disclosure, by individual pick-and-place of the micro LED chip 200, the micro LED chip 200 may be bonded onto the pad 110.

Here, in order to repair the ultra-fine size micro LED chip 200, in the pick-and-place process, it is important to precisely monitor the position and posture of the LED chip and move the same.

Hereinbelow, the detailed configuration of the pick-and-place apparatus of micro LED chip for chip-repairing of micro LED display of the present disclosure will be described.

Figure 2:
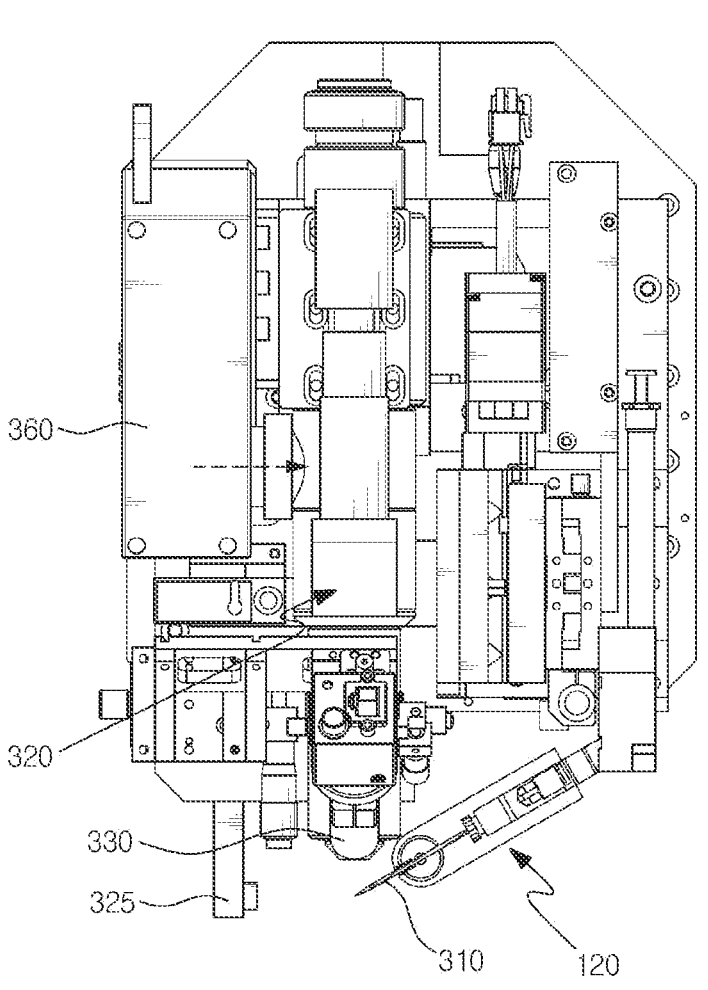
FIG. 2 is a view illustrating a pick-and-place apparatus of micro LED chip for chip-repairing of micro LED display according to an embodiment of the present disclosure.
Figure 3:
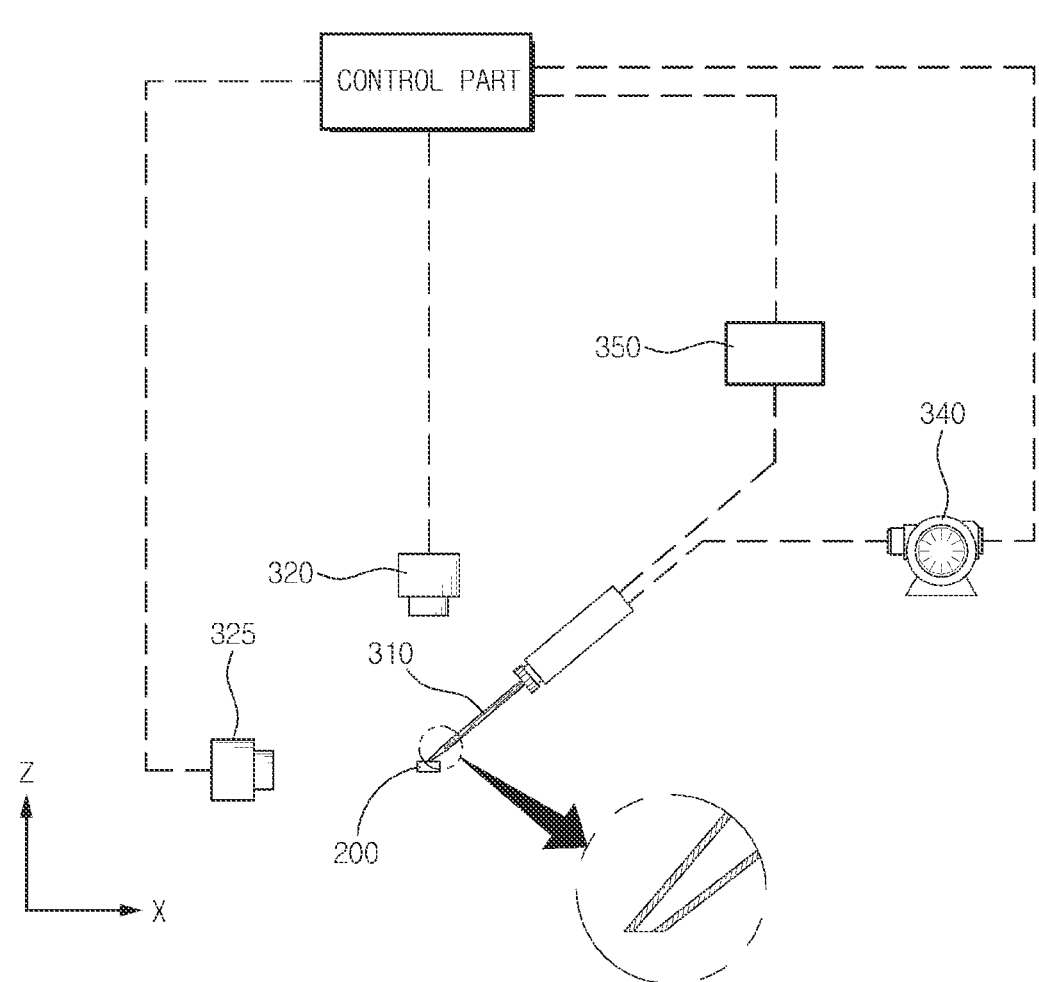
FIG. 3 is a concept view schematically illustrating the configuration of the apparatus in FIG. 1.
Figure 4:
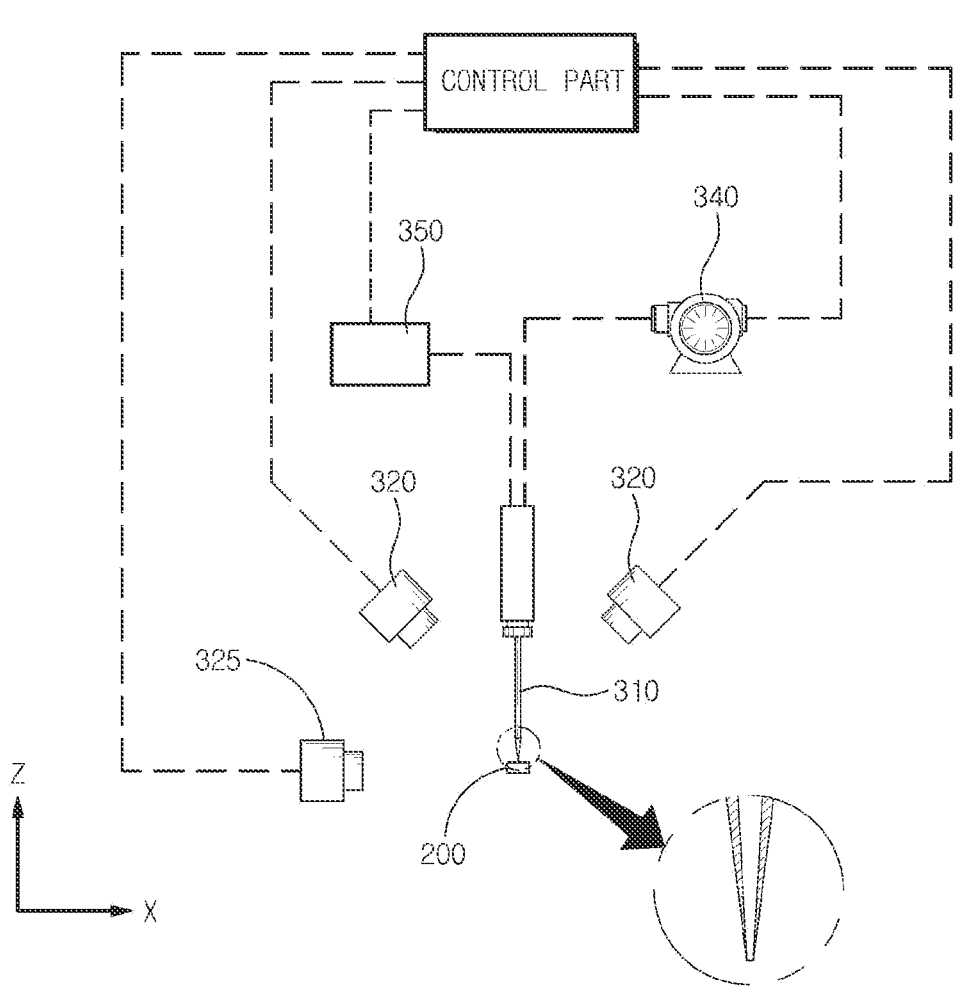
FIG. 4 is a concept view illustrating a modified example of FIG. 3.
Figure 5:
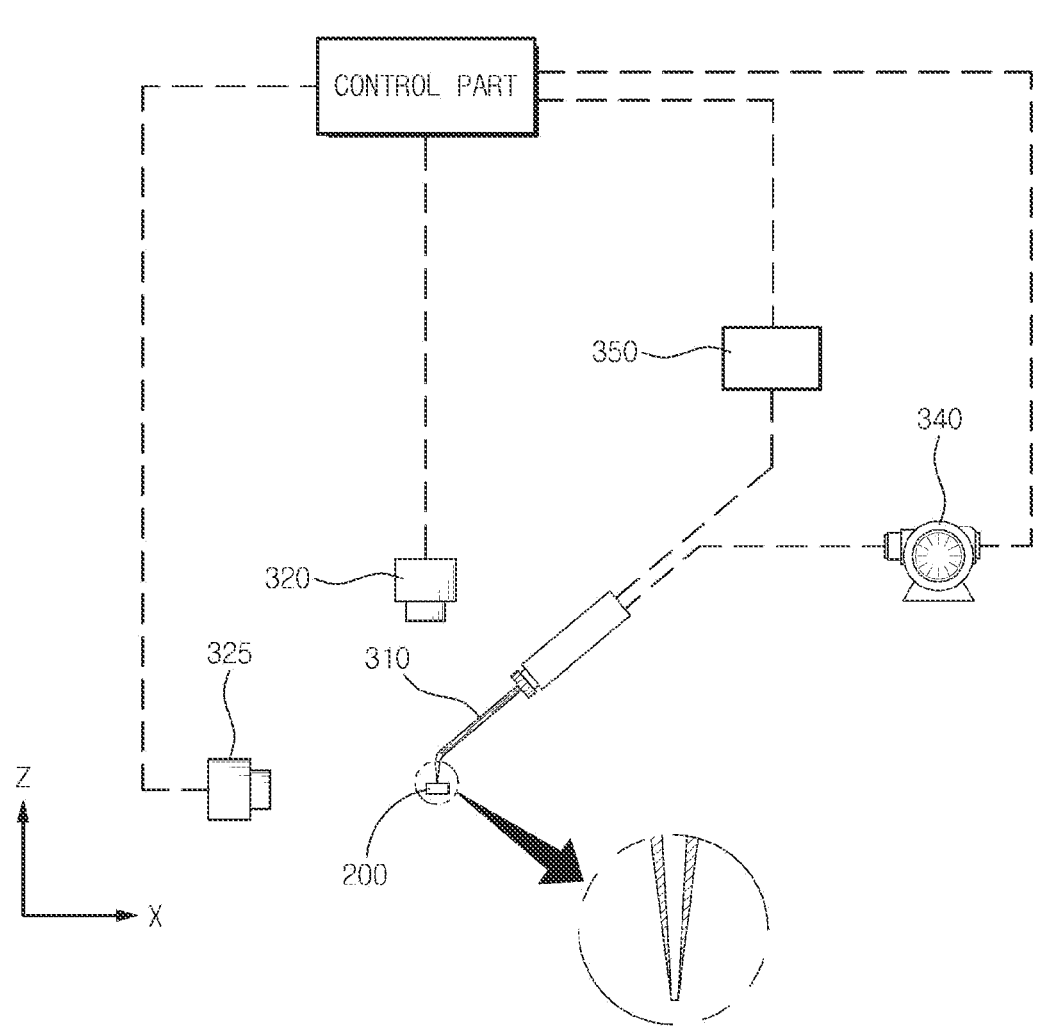
FIG. 5 is a concept view illustrating another modified example of FIG. 3.
Figure 6:
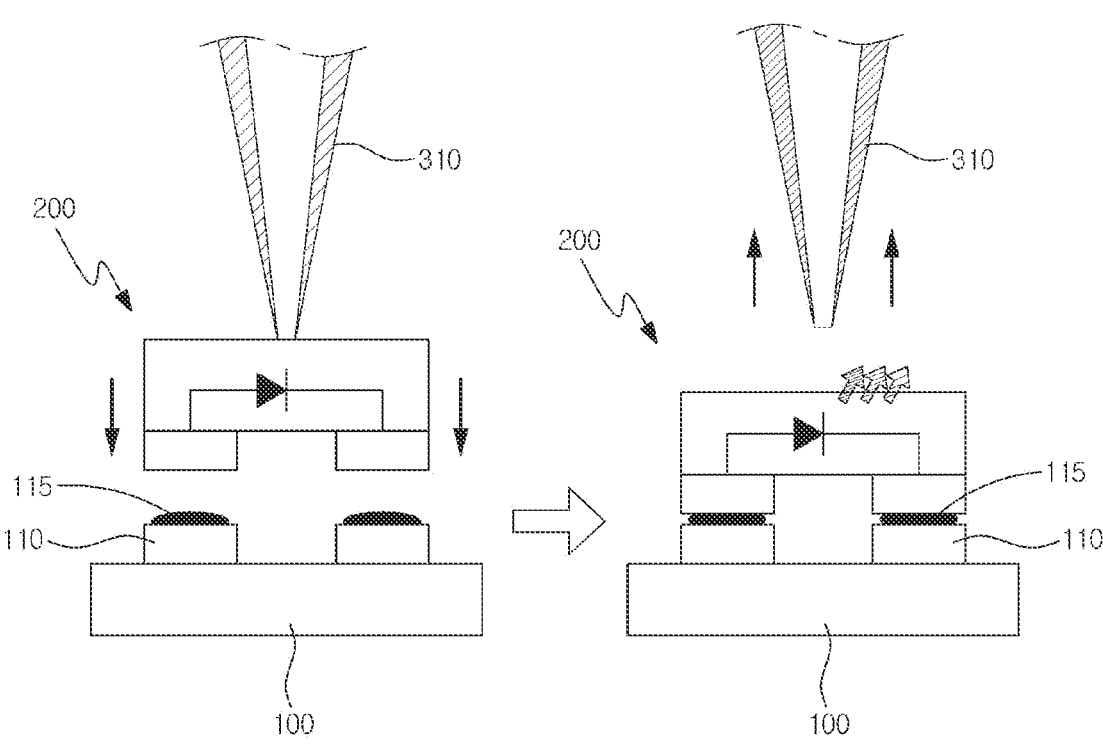
FIG. 6 is a view illustrating a one-by-one mounting process using a pick-and-place apparatus of micro LED chip for chip-repairing of micro LED display according to the present disclosure.
Figure 7:
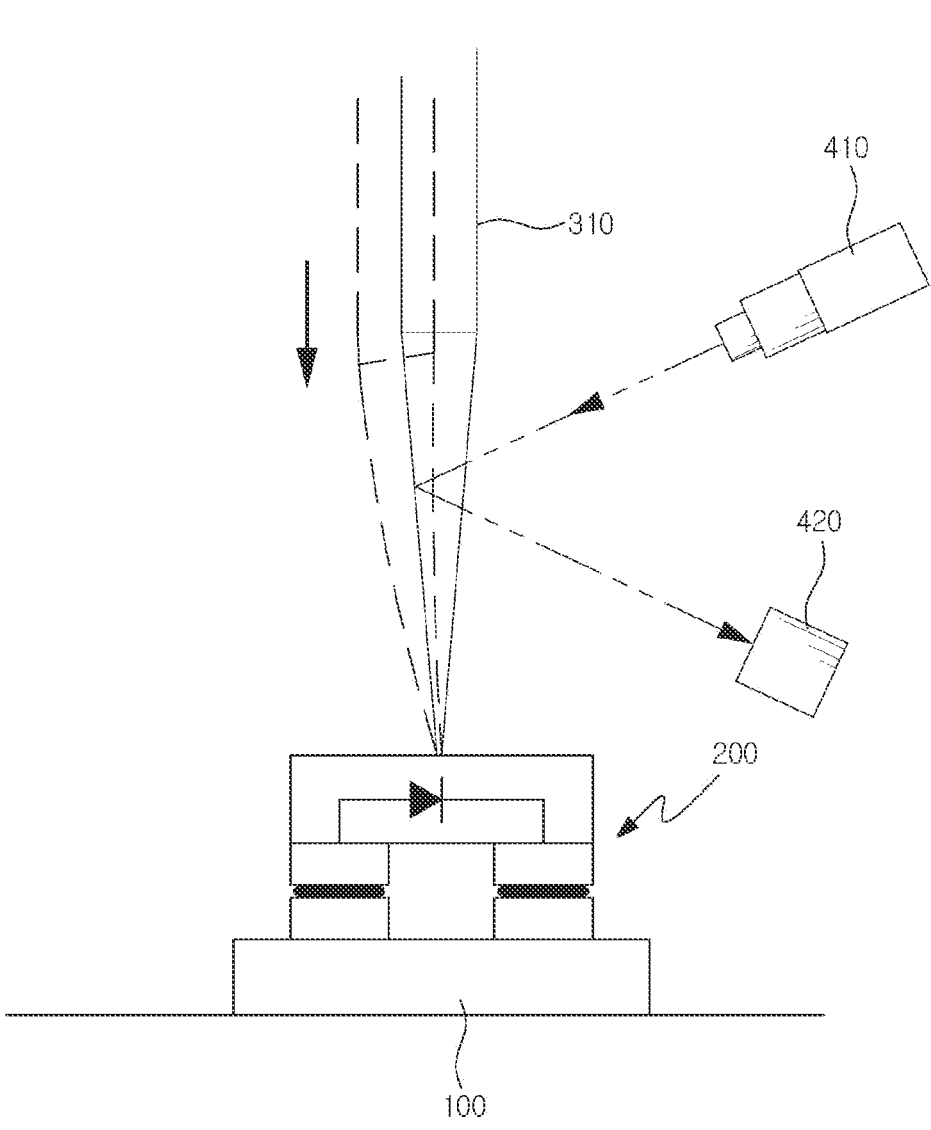
FIG. 7 is a view illustrating the configuration of a pressing force measurement part according to an embodiment of the present disclosure.

FIG. 2 is a view illustrating a pick-and-place apparatus of micro LED chip for chip-repairing of micro LED display according to an embodiment of the present disclosure, FIG. 3 is a concept view schematically illustrating the configuration of the apparatus in FIG. 1, FIG. 4 is a concept view illustrating a modified example of FIG. 3, FIG. 5 is a concept view illustrating another modified example of FIG. 3, FIG. 6 is a view illustrating a one-by-one mounting process using a pick-and-place apparatus of micro LED chip for chip-repairing of micro LED display according to the present disclosure, and FIG. 7 is a view illustrating the configuration of a pressing force measurement part according to an embodiment of the present disclosure.

The pick-and-place apparatus of micro LED chip for chip-repairing of micro LED display according to an embodiment of the present disclosure may include a nozzle 310, a pressure adjustment part 340, an imaging part 320, 325, a moving part 350 and a control part.

The nozzle 310 may be made in a capillary form having a nozzle tip with a cross-section that is smaller than the size of a top area of the micro LED chip 200. After the nozzle tip is moved to be in contact with or approximated to the micro LED chip 200, due to the adsorption caused by negative pressure applied inside the nozzle 310, the micro LED chip 200 may be adsorbed (picked) to the nozzle tip. Here, since the cross-sectional area of the nozzle tip is smaller than the size of the micro LED chip 200, even if the micro LED chip has the size of several micrometers, the imaging part 320, 325 described hereinafter can monitor the position and posture of the chip adsorbed to the nozzle tip in real time. In the case of an existing pick-and-place apparatus, a unit bigger than the chip lifts up the chip, and thus the deviation of the position and the posture of the chip during the mounting process cannot be monitored in real time, and thus there was much difficulty in precisely positioning the chip on top of the adhesive.

As illustrated in the enlarged view of FIG. 4, an entirety of the nozzle 310 or at least an end portion of the nozzle 310 may be formed to have a diameter that gradually decreases. Therefore, it may be more easier for the imaging part 320, 325 to monitor in real time the position and posture of the micro LED chip 200 adsorbed to the nozzle tip while minimizing the contact surface between the nozzle tip and the micro LED chip 200.

Here, it is preferable that, during the adsorption, the face of the nozzle tip closely contacts the top surface of the chip so that the negative pressure inside a nozzle doesn't leak. Thus, when manufacturing the ultra-fine size nozzle 310 having the form of a capillary, it is preferable to perform a precise cutting process on the face of the nozzle tip using thermal processing, laser processing, and ion beam processing etc.

Further, the nozzle tip may be coated with a flexible material to prevent leaking when adsorbing the chip thereto. PDMS may be used as the flexible material, but there is no limitation thereto.

Here, the nozzle 310 may be made of any one material of glass, metal tube, ceramic, and polymer.

Although not illustrated, a cleaning part may be formed for keeping the nozzle tip clean all the time. The cleaning part may be configured to spray gas towards the nozzle tip, or to spray cleaning water and dry the sprayed cleaning water.

Further, in order to prevent the adsorption being interrupted by static electricity when approximating the nozzle tip to the micro LED chip 200 and adsorbing the chip, an ionizer 330 for removing the static electricity from the nozzle tip may be further included.

The pressure adjustment part 340 applies negative pressure to a fine tube inside the nozzle 310 so that the micro LED chip 200 can be adsorbed to the nozzle tip. When the pressure adjustment part 340 applies the negative pressure inside the nozzle 310 in a state where the nozzle tip is moved to contact the micro LED chip 200 or approximated to the micro LED chip 200, the micro LED chip 200 can be adsorbed to the nozzle tip. Further, when the negative pressure is removed inside the nozzle or a positive pressure is applied inside the nozzle after the micro LED chip 200 adsorbed to the nozzle tip is positioned onto a repair pixel, the micro LED chip 200 may be separated from the nozzle tip.

The pressure adjustment part 340 may be configured as, for example, a vacuum pump.

The imaging part 320, 325 may monitor the position and posture of the micro LED chip 200 adsorbed to the nozzle tip, in real time.

As illustrated in FIGS. 2 and 3, the nozzle 310 may be disposed to be inclined with respect to the substrate 100. Here, a first imaging part 320 is not interrupted by the nozzle 310, and thus disposed above the nozzle tip, and may obtain an image of the micro LED chip 200 adsorbed to the nozzle tip in a vertically downward direction, Therefore, from a real time image obtained from the first imaging part 320, the position and posture of the micro LED chip 200 adsorbed to the nozzle tip can be identified on an xy plane (hereinbelow, it will be described based on the coordinate system illustrated in FIG. 1). That is, an xy position and a rotation angle θ around z axis of the micro LED chip 200 can be identified.

Moreover, since the nozzle tip is not always located at the exact center of the micro LED chip 200, the position of the nozzle tip can also be identified through the first imaging part 320, Here, as the first imaging part 320 changes the focus of an image to the micro LED chip 200 or the nozzle tip, each image for obtaining the aforementioned information may be obtained more precisely.

In addition, by the first imaging part 320 that obtains an image in a vertically downward direction of the nozzle tip, an image of a repair pixel, that is a repair area on the substrate 100, may be obtained.

The second imaging part 320 may be disposed at a side of the nozzle tip to obtain an image of the micro LED chip 200 adsorbed to the nozzle tip in a horizontal direction. Therefore, from a real time image obtained from the second imaging part 325, a position in z axis direction and rotation angle φ around y axis of the micro LED can be identified. Likewise, the second imaging part 325 may identify the z direction position of the nozzle tip. Here, the second imaging part 325 may obtain each image for obtaining the aforementioned information more precisely, while changing the focus of the image to the micro LED chip 200 or the nozzle tip.

As such, as the first imaging part 320 and the second imaging part 325 monitor the repair area of the substrate 100 together with the position of the nozzle tip and the position and posture of the micro LED chip 200 adsorbed to the nozzle tip in real time, it is possible to move and mount the micro LED chip 200 right above the repair pixel while changing the position and posture of the nozzle 310 by the moving part 350 that will be described hereinafter.

In a case where the nozzle 310 is disposed to be inclined with respect to the substrate 100 as in the present embodiment, the face of the nozzle tip of the nozzle that is disposed to be inclined is preferable to be processed horizontally on the xy plane as illustrated in the enlarged view of FIG. 3. Therefore, even when the nozzle 310 is disposed to be inclined with respect to the substrate 100, the micro LED tip adsorbed to the nozzle tip may be adsorbed in a direction substantially horizontal to the xy plane.

In another embodiment, as illustrated in FIG. 4, the nozzle 310 may be disposed vertically downward with respect to the substrate 100. Here, at least one first imaging part 320 may be disposed at one side of the nozzle 310 (in the drawings, one is disposed at each side), to obtain an image of the micro LED chip 200 adsorbed to the nozzle tip in a direction inclined with respect to the vertically downward direction. In this case, compared to the case where the first imaging part 320 is disposed vertically above the micro LED chip 200, the information of the xy position and rotation angle θ obtained by the image may be less accurate, and thus a plurality of first imaging parts 320 that photograph in different angles from different positions may be provided to increase the measurement accuracy.

Here, as in the embodiment described above, the second imaging part 325 may be disposed at one side of the nozzle tip to obtain the image of the micro chip adsorbed to the nozzle tip in a horizontal direction.

In another embodiment, as illustrated in FIG. 5, the nozzle 310 may be disposed to be inclined with respect to the substrate 100, but while one intermediate part of the nozzle 310 has a downwardly bent form with respect to the substrate 100. Here, it is preferable that an end portion of the nozzle 310 is bent so as to face vertically downward with respect to the substrate 100.

As the nozzle 310 is disposed to be inclined, as in the embodiment of FIG. 3, the first imaging part 320 may be disposed above the nozzle tip, thereby easily obtaining the image of the micro LED chip 200 adsorbed to the nozzle tip in the vertically downward direction.

Further, as the end portion of the nozzle 310 is formed to face towards the substrate 100, negative pressure may be formed in a vertical direction with respect to the substrate 100 as in the embodiment of FIG. 4, thereby adsorbing the micro LED chip 200.

The pick-and-place apparatus of micro LED chip for chip-repairing of micro LED display according to the present disclosure may further include a distance measurement part 360. The distance measurement part 360 may measure the distance between the nozzle tip and the substrate 100, and based on the measured distance, together with the position and posture information of the micro LED chip 200 obtained from the imaging part 320, 325, may position and mount the micro LED chip 200 vertically above the pad 110 while changing the position and posture of the nozzle 310 by the moving part 350.

For example, a laser distance sensor that measures the distance using laser may be used as the distance measurement part 360.

The moving part 350 moves the nozzle 310. In the present disclosure, moving the nozzle 310 may mean not only changing the spatial position of the nozzle 310 but also changing the posture of the nozzle 310, The moving part 350 may be configured to include a transfer part for transferring the nozzle 310 in space and a posture change part for changing the posture of the nozzle 310. For example, the transfer part may consist of an X axis transfer part, a Y axis transfer part, and a Z axis transfer part for moving the nozzle 310 in each of XYZ axis directions. Further, in order to change the posture of the micro LED chip 200 adsorbed to the nozzle tip, the posture change part may consist of a θ axis rotation part for rotating the nozzle 310 based on the axis of the nozzle 310 and a φ axis rotation part for rotating the nozzle 310 based on one point on the axis of the nozzle 310. The configuration of the transfer part and posture change part are known using a motor and moving block etc., and thus a detailed description thereof will be omitted.

The control part may receive the position and posture information of the micro LED chip 200, position information of the nozzle tip and distance information between the nozzle tip and the substrate 100 from the imaging part 320, 325 or the distance measurement part 360, and may control the pressure adjustment part 340 and the moving part 350 to adsorb the micro LED chip 200 to the nozzle tip, and may move the nozzle 310 so that the micro LED chip 200 is positioned vertically above the repair pixel, FIG. 6 is a view illustrating a one-by-one mounting process using a pick-and-place apparatus of micro LED chip for chip-repairing of micro LED display according to the present disclosure.

In a state where the micro LED chip 200 is adsorbed to the nozzle tip by applying negative pressure inside the nozzle 310 by the pressure adjustment part 340 as illustrated in the left side of the FIG. 6, the control part may change the position and posture of the nozzle 310 such that the adsorbed micro LED chip 200 is positioned vertically above the repair pixel onto which the adsorbed LED chip 200 is to be mounted based on the information of the imaging part and distance measurement part 360.

As illustrated in the right side of FIG. 6, after the micro LED chip 200 is seated above the pad 110 where the conductive adhesive material 115 is patterned, in order to improve the adhesion with the pad 110, it is preferable to press towards the pad 110 with a certain degree of force. Therefore, in a state where the micro LED chip 200 is seated on the pad 110, it is preferable to transfer the nozzle 310 towards the substrate 100 very finely.

Here, in the present disclosure, a pressing force measurement part may be further included. The pressing force measurement part measures the pressing force when moving the nozzle 310 vertically downward in order to increase the adhesive force after seating the micro LED chip 200 on the repair pixel.

When pressing the repair pixel using the nozzle 310, the nozzle 310 formed as a capillary may be easily bent, and by measuring the bent degree of the nozzle 310, it is possible to identify the pressing force. The greater the pressing force, the more severely the nozzle 310 may be bent.

Thus, the pressing force measurement part may be configured to include a light emitting part 410 that may be disposed at one side of the nozzle 310 to irradiate light such as laser towards the nozzle 310, a light receiving part 420 for receiving the light irradiated from the light emitting part 410 and reflected from the nozzle 310, and a determining part that analyzes a signal of the light received in the light receiving part 420 to identify the bent degree of the nozzle 310, and based on the identified bent degree of the nozzle, measures the force of pressing the repair pixel through the nozzle 310. In a state where the positions of the light emitting part 410 and the light receiving part 420 are fixed, if the nozzle 310 is bent, the amount of light reflected from the nozzle 310 and reflected and received will differ, and based on this, the determining part may identify the bent degree of the nozzle 310 based on the signal received in the light receiving part 420.

The control part may bond the micro LED chip to the pad 110 while adjusting the pressing force based on the value measured by the pressing force measurement part.

The scope of right of the present disclosure is not limited to the aforementioned embodiment, but may be implemented in various forms of embodiments within the claims set attached hereto. It should be understood that various changes and alternations can be made without departing from the spirit and field of the present disclosure claimed in the claims set.

REFERENCE NUMERALS

100: SUBSTRATE
110: PAD
115: CONDUCTIVE ADHESIVE MATERIAL

200: MICRO LED CHIP
310: NOZZLE
320: FIRST IMAGING PART
325: SECOND IMAGING PART
330: IONIZER
340: PRESSURE ADJUSTMENT PART
350: MOVING PART
360: DISTANCE MEASUREMENT PART
410: LIGHT EMITTING PART
420: LIGHT RECEIVING PART

What is claimed is:

1. A pick-and-place apparatus of micro LED chip for chip-repairing of micro LED display, comprising:
   a nozzle having a capillary form and having a nozzle tip that is smaller than a top size area of the micro LED chip;
   a pressure adjustment part that applies negative pressure inside the nozzle to adsorb the micro LED chip to the nozzle tip and applies positive pressure inside the nozzle or removes the negative pressure inside the nozzle to mount the micro LED chip adsorbed to the nozzle tip onto a repair pixel;
   an imaging part that monitors a position and posture of the micro LED chip adsorbed to the nozzle tip in real time;
   a moving part that moves the nozzle;
   a control part that receives image information from the imaging part, and mounts the micro LED chip onto the repair pixel while controlling the pressure adjustment part and the moving part; and
   a pressing force measurement part that measures a force pressing to the nozzle in order to mount the micro LED chip onto the repair pixel;
   wherein the pressing force measurement part measures a bent degree of the nozzle and measures the pressing force based on the measured bent degree of the nozzle.

2. The pick-and-place apparatus of micro LED chip for chip-repairing of micro LED display, according to claim 1, wherein an end portion of the nozzle is formed such that its diameter gradually decreases.

3. The pick-and-place apparatus of micro LED chip for chip-repairing of micro LED display, according to claim 1, wherein the nozzle is formed of any one of glass, metal tube, ceramic, and polymer.

4. The pick-and-place apparatus of micro LED chip for chip-repairing of micro LED display, according to claim 1, wherein the nozzle tip is coated with a flexible material.

5. The pick-and-place apparatus of micro LED chip for chip-repairing of micro LED display, according to claim 4, wherein the flexible material is PDMS.

6. The pick-and-place apparatus of micro LED chip for chip-repairing of micro LED display, according to claim 1, further comprising a cleaning part that cleans the nozzle tip.

7. The pick-and-place apparatus of micro LED chip for chip-repairing of micro LED display, according to claim 1, further comprising an ionizer that removes static electricity from the nozzle tip.

8. The pick-and-place apparatus of micro LED chip for chip-repairing of micro LED display, according to claim 1, wherein a face of the nozzle tip of the nozzle disposed to be inclined is processed horizontally on the xy plane.

9. The pick-and-place apparatus of micro LED chip for chip-repairing of micro LED display, according to claim 1, wherein the nozzle is disposed to be inclined with respect to a substrate, but one intermediate part of the nozzle has a bent form such that an end portion of the nozzle faces the substrate.

10. The pick-and-place apparatus of micro LED chip for chip-repairing of micro LED display, according to claim 9,
   wherein the imaging part comprises a first imaging part that obtains an image of the micro LED chip adsorbed to the nozzle tip, in a vertically downward direction from above the nozzle tip, and that monitors the position and posture of the micro LED chip on an xy plane; and
   a second imaging part that obtains the image of the micro LED chip adsorbed to the nozzle tip in a horizontal direction, and that monitors the position and posture of the micro LED chip in a z axis direction.

11. The pick-and-place apparatus of micro LED chip for chip-repairing of micro LED display, according to claim 1,
   wherein the pressing force measurement part comprises a light emitting part that irradiates light towards the nozzle;
   a light receiving part that receives the light reflected from the nozzle; and
   a determining part that analyzes a signal of the light received in the light receiving part and measures the bent degree of the nozzle.

12. The pick-and-place apparatus of micro LED chip for chip-repairing of micro LED display, according to claim 1,
   wherein the moving part comprises a transfer part that transfers the nozzle in space; and
   a posture change part that changes a posture of the nozzle in order to change the posture of the micro LED chip adsorbed to the nozzle tip.

13. The pick-and-place apparatus of micro LED chip for chip-repairing of micro LED display, according to claim 1,
   wherein the nozzle is disposed vertically downward towards a substrate, and
   the imaging part comprises at least one or more first imaging part disposed at one side of the nozzle, that obtains an image of the micro LED chip adsorbed to the nozzle tip, in a direction inclined with respect to a vertically downward direction, and that monitors the position and posture of the micro LED chip on an xy plane; and
   a second imaging part that obtains the image of the micro LED chip adsorbed to the nozzle tip in a horizontal direction, and monitors the position and posture of the micro LED chip in a z axis direction.

14. The pick-and-place apparatus of micro LED chip for chip-repairing of micro LED display, according to claim 1,
   wherein the nozzle is disposed to be inclined with respect to a substrate, and
   the imaging part comprises a first imaging part that obtains an image of the micro LED chip adsorbed to the nozzle tip, in a vertically downward direction from above the nozzle tip, and that monitors the position and posture of the micro LED chip on an xy plane; and
   a second imaging part that obtains the image of the micro LED chip adsorbed to the nozzle tip in a horizontal direction, and monitors the position and posture of the micro LED chip in a z axis direction.

* * * * *